United States Patent
Nakanishi et al.

(10) Patent No.: US 10,633,529 B2
(45) Date of Patent: Apr. 28, 2020

(54) RESIN COMPOSITION

(71) Applicant: AGC Inc., Chiyoda-ku (JP)

(72) Inventors: Tomoaki Nakanishi, Chiyoda-ku (JP);
Toshiaki Sawada, Chiyoda-ku (JP);
Seigo Kotera, Chiyoda-ku (JP); Shinji Wada, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 528 days.

(21) Appl. No.: 15/168,868

(22) Filed: May 31, 2016

(65) Prior Publication Data

US 2016/0272805 A1    Sep. 22, 2016

Related U.S. Application Data (63) Continuation of application No. PCT/JP2014/083788, filed on Dec. 19, 2014.

(30) Foreign Application Priority Data

Dec. 27, 2013 (JP) .................. 2013-271747
Jul. 28, 2014 (JP) .................. 2014-153221

(51) Int. Cl.
*C08L 27/18* (2006.01)
*C08J 5/18* (2006.01)
(Continued)

(52) U.S. Cl.
CPC .............. *C08L 27/18* (2013.01); *B32B 27/08* (2013.01); *B32B 27/304* (2013.01);
(Continued)

(58) Field of Classification Search
CPC .......... C08L 27/18; C08L 69/00; C08L 67/00; B32B 7/12; B32B 27/322; B32B 27/304;
(Continued)

(56) References Cited

U.S. PATENT DOCUMENTS 5,670,593 A * 9/1997 Araki .................. C07C 33/423
526/240
5,750,626 A   5/1998 Shimizu et al.
(Continued)

FOREIGN PATENT DOCUMENTS

JP    55-56123 A    4/1980
JP    57-121045     4/1982
(Continued)

OTHER PUBLICATIONS

EPO Translation of JP-2010180365-A (Year: 2018).*
International Search Report dated Mar. 24, 2015 in PCT/JP2014/083788 filed on Dec. 19, 2014.

*Primary Examiner* — Michael Zhang
(74) *Attorney, Agent, or Firm* — Oblon, McClelland, Maier & Neustadt, L.L.P.

(57) ABSTRACT

To provide a resin composition having excellent mechanical strength and elongation, its melt-kneaded product and a molding product thereof.
A resin composition comprising a fluororesin having a hydroxy group or a carbonyl group, an ester bond-containing resin having no fluorine atom and a transesterification catalyst, a melt-kneaded product obtained by melt-kneading the resin composition, a molding product, film or sheet obtained from the resin composition or the melt-kneaded product, a laminated product, a backsheet for a solar cell, and a method for producing a molding product using the resin composition or the melt-kneaded product.

19 Claims, 2 Drawing Sheets

(A) Ex. 7
(AA): 0.089 island/μm²

(B) Ex. 14
(BB): 0.256 island/μm²

(51) Int. Cl.
*H01L 31/049* (2014.01)
*B32B 27/08* (2006.01)
*B32B 27/36* (2006.01)
*B32B 27/30* (2006.01)

(52) U.S. Cl.
CPC ............... *B32B 27/365* (2013.01); *C08J 5/18* (2013.01); *H01L 31/049* (2014.12); *B32B 2250/03* (2013.01); *B32B 2250/24* (2013.01); *B32B 2307/712* (2013.01); *B32B 2457/12* (2013.01); *C08J 2327/18* (2013.01); *C08J 2469/00* (2013.01)

(58) Field of Classification Search
CPC ....... B32B 27/365; B32B 27/08; B32B 27/36; B32B 2307/732; B32B 2307/54; B32B 2250/24; B32B 2250/03; B32B 2457/12; B32B 2307/712; C08J 5/18; C08J 2327/18; C08J 2467/00; C08J 2469/00; H01L 31/049; Y02E 10/50; C08K 2003/2296; C08K 2003/2224
See application file for complete search history.

(56) References Cited

U.S. PATENT DOCUMENTS

| | | | |
|---|---|---|---|
| 5,869,574 A | 2/1999 | Shimizu et al. | |
| 5,986,150 A | 11/1999 | Araki et al. | |
| 6,054,537 A | 4/2000 | Shimizu et al. | |
| 6,139,946 A | 10/2000 | Bailey et al. | |
| 6,372,870 B1 * | 4/2002 | Kitahara | B32B 27/08 526/250 |
| 6,552,127 B1 | 4/2003 | Shimizu et al. | |
| 2003/0166780 A1 | 9/2003 | Shimizu et al. | |
| 2008/0227994 A1 | 9/2008 | Glasl et al. | |
| 2011/0220184 A1 * | 9/2011 | Aruga | B32B 7/12 136/251 |
| 2013/0281619 A1 * | 10/2013 | Uehira | C08G 63/199 524/604 |
| 2015/0007886 A1 | 1/2015 | Takegami | |

FOREIGN PATENT DOCUMENTS

| | | | |
|---|---|---|---|
| JP | 60-72951 | | 4/1985 |
| JP | 4-48820 | | 8/1992 |
| JP | 2000-80161 A | | 3/2000 |
| JP | 2002-544359 | | 12/2002 |
| JP | 2003-246905 | | 9/2003 |
| JP | 2009-502812 A | | 1/2009 |
| JP | 2010-180365 | | 8/2010 |
| JP | 2010180365 A | * | 8/2010 |
| JP | 2013-139578 | | 7/2013 |
| JP | 2014-129465 | | 7/2014 |
| WO | WO 95/33782 | | 12/1995 |
| WO | WO 2008/069278 A1 | | 6/2008 |
| WO | WO 2013/146516 A1 | | 10/2013 |
| WO | WO 2014/189017 A1 | | 11/2014 |

* cited by examiner

(AA): 0.089 island/μm²

(B) Ex. 14

(BB): 0.256 island/μm²

Fig. 2

RESIN COMPOSITION

This application is a continuation of PCT Application No. PCT/JP2014/083788 filed on Dec. 19, 2014, which is based upon and claims the benefit of priority from Japanese Patent Application No. 2013-271747 filed on Dec. 27, 2013 and Japanese Patent Application No. 2014-153221 filed on Jul. 28, 2014. The contents of those applications are incorporated herein by reference in their entireties.

TECHNICAL FIELD

The present invention relates to a resin composition comprising a fluororesin, its melt-kneaded product, a molding product, film or sheet thereof, a laminated product, a backsheet for a solar cell, and a method for producing a molding product.

BACKGROUND ART

A fluororesin is used for various applications in which conventional plastics cannot be used, since it is excellent in the solvent resistance, the low dielectric property, the low surface energy property, the non-adherence, the weather resistance, etc. Particularly, an ethylene/tetrafluoroethylene copolymer (hereinafter sometimes referred to as "ETFE"), which is a fluororesin excellent in the heat resistance, the flame retardancy, the chemical resistance, the weather resistance, the low abrasion property, the low dielectric property, etc., is used in a wide range of fields including a heat resistant electric wire-covering material, a corrosion resistant piping material for chemical plant, an agricultural plastic greenhouse material, a mold release film, etc. In recent years, its application to a backsheet for a solar cell attracts attention. A backsheet for a solar cell is generally required to have heat resistance, weather resistance and chemical resistance for use in a long period of time, a low dielectric property to improve the performance of the entire solar cell system, etc. Accordingly, the backsheet for a solar cell may be considered to be an application in which properties of a fluororesin represented by an ETFE can be made use of.

In order to further improve properties of a fluororesin used for various applications including a backsheet for a solar cell, for example, a technique to blend a fluororesin with other type of resins has been proposed (for example, Patent Documents 1 to 3).

PRIOR ART DOCUMENTS

Patent Documents

Patent Document 1: JP-A-57-121045
Patent Document 2: JP-A-60-72951
Patent Document 3: JP-A-2002-544359

DISCLOSURE OF INVENTION

Technical Problem

A fluororesin is generally immiscible in other types of resins. Accordingly, the above technique has problems such that if a fluororesin is merely blended with other type of resins in binary system, the dispersed phase in the mixture tends to coarsen due to mutual immiscibility, therefore lowering the mechanical strength and the elongation. For example, although an ester bond-containing resin such as a polycarbonate resin is a resin excellent in mechanical properties, even if it is bended to a fluororesin in order to improve the mechanical properties, they tend to decrease due to the mutual immiscibility and coarsening of the dispersed phase.

It is an objective of the present invention to provide a molding compound comprising a resin composition or its melt-kneaded product, to produce a molding product having excellent mechanical strength and elongation. Further, it is to provide a molding product, film or sheet obtained from such a molding compound, a laminated product, a backsheet for a solar cell, and a method for producing a molding product using the resin material for molding compound.

Solution to Problem

The present invention provides the following constructions [1] to [15].

[1] A resin composition comprising a fluororesin having at least one of a hydroxy group and a carbonyl group, an ester bond-containing resin having no fluorine atom, and a transesterification catalyst.

[2] The resin composition according to [1], wherein the ester bond-containing resin is a polyester resin or a polycarbonate resin.

[3] The resin composition according to [1] or [2], wherein the volume ratio of the fluororesin to the ester bond-containing resin is from 40/60 to 99.9/0.1.

[4] The resin composition according to any one of [1] to [3], wherein the content of the transesterification catalyst is from 0.001 to 20 parts by mass per 100 parts by mass of the sum of the fluororesin, the ester bond-containing resin and the transesterification catalyst.

[5] The resin composition according to any one of [1] to [4], wherein the fluororesin is an ethylene/tetrafluoroethylene copolymer or a tetrafluoroethylene/perfluoroalkyl vinyl ether copolymer.

[6] The resin composition according to any one of [1] to [5], wherein the transesterification catalyst is at least one member selected from the group consisting of a metal salt of an organic acid, a metal salt of a carbonic acid, a metal oxide and a metal hydroxide.

[7] The resin composition according to [6], wherein the transesterification catalyst is at least one member selected from the group consisting of a zinc salt of a carboxylic acid, a magnesium salt of a carboxylic acid, zinc carbonate, magnesium carbonate, zinc oxide, magnesium oxide, zinc hydroxide and magnesium hydroxide.

[8] A molding compound, consisting of a melt-kneaded product of the resin composition as defined in any one of [1] to [7].

[9] A method for producing a molding compound, which comprises melt-kneading the resin composition as defined in any one of [1] to [7].

[10] A molding product obtained by melt-processing the resin composition as defined in any one of [1] to [7] or the molding compound as defined in [8].

[11] The molding product according to [10], which has a micro-phase separation structure having a continuous phase and a dispersed phase, the continuous phase consists of the fluororesin, and the dispersed phase consists of the ester bond-containing resin.

[12] The molding product according to [10] or [11], which is a film or a sheet.

[13] A laminated product having at least three-layered structure of a layer of the molding product as defined in any one of [10] to [12], a layer of a fluororesin and a layer of an ester bond-containing resin, wherein the layer of the molding product is disposed between the layer of a fluororesin and the layer of an ester bond-containing resin.

[14] A backsheet for a solar cell, comprising the film or the sheet as defined in [12] having a thickness of from 10 to 100 μm.

[15] A method for producing a molding product, which comprises melt-processing the molding compound as defined in [8].

Advantageous Effects of Invention

A molding product obtained from the resin composition of the present invention is excellent in the mechanical strength and the elongation.

The backsheet for a solar cell of the present invention has a film excellent in the mechanical strength and the elongation.

DESCRIPTION OF EMBODIMENTS

[Resin Composition]

The resin composition of the present invention comprises a fluororesin having at least one of a hydroxy group and a carbonyl group (hereinafter sometimes referred to as "a functional group (I)"), an ester bond-containing resin having no fluorine atom, and a transesterification catalyst.

The functional group (I) may be present on its side chain or at its terminal. In view of excellent reactivity with the ester bond-containing resin having no fluorine atom, it is preferably present at the terminal, and with a view to increasing the number of functional groups in the fluororesin, it is preferably present on the side chain.

In a case where the functional group (I) is present at the terminal, its content is preferably from 1 to 50,000, more preferably from 10 to 5,000, particularly preferably from 100 to 1,000, by the number of terminal functional groups (I) per $10^6$ carbon atoms. When the number of the terminal functional groups (I) is within the above range, the fluororesin will be excellent in the reactivity, the forming property and the mechanical strength. The number of the terminal functional groups (I) may be calculated from an infrared absorption spectrum (IR) by the method disclosed in JP-A-60-240713.

In a case where the functional group (I) is preset on the side chain, the content of units having the functional group (I) is preferably from 0.01 to 80 mol %, more preferably from 0.01 to 60 mol %, particularly preferably from 0.01 to 30 mol % in all the structural units of the fluororesin. The content of the units having the functional group (I) may be calculated by $^1$H-NMR and $^{19}$F-NMR.

(Fluororesin)

The fluororesin in the present invention has units having a fluorine atom (hereinafter sometimes referred to as "fluorinated units"). The fluorinated units are units derived from a monomer having a fluorine atom (hereinafter sometimes referred to as "a fluorinated monomer"). The fluorinated monomer may, for example, be a fluoroethylene such as $CF_2$=$CF_2$ (hereinafter sometimes referred to as "TFE"), $CF_2$=CFCl or $CF_2$=$CH_2$; a $C_{3-5}$ perfluoroolefin such as hexafluoropropylene (hereinafter sometimes referred to as "HFP" or octafluorobutene-1; a polyfluoroalkylethylene represented by $X^1(CF_2)_nCY^1$=$CH_2$ (wherein each of $X^1$ and $Y^1$ is a hydrogen atom or a fluorine atom, and n is an integer of from 2 to 8); a perfluorovinyl ether represented by $R^fOCFX^2(CF_2)_mOCF$=$CF_2$ (wherein $R^f$ is a $C_{1-6}$ perfluoroalkyl group, $X^2$ is a fluorine atom or a trifluoromethyl group, and m is an integer of from 0 to 5); a perfluorovinyl ether having a group capable of being easily converted to a carboxylic acid group or a sulfonic acid group, such as $CH_3OC(=O)CF_2CF_2CF_2OCF$=$CF_2$ or $FSO_2CF_2CF_2OCF(CF_3)CF_2OCF$=$CF_2$; a perfluoro(alkenyl vinyl ether) such as $CF_2$=$CFOCF_2CF$=$CF_2$ or $CF_2$=$CFO(CF_2)_2CF$=$CF_2$; or a fluorinated monomer having an aliphatic cyclic structure such as perfluoro(2,2-dimethyl-1,3-dioxole), 2,2,4-trifluoro-5-trifluoromethoxy-1,3-dioxole or perfluoro(2-methylene-4-methyl-1,3-dioxolane).

In the polyfluoroalkylethylene represented by $X^1(CF_2)_nCY^1$=$CH_2$, n is preferably from 2 to 6, particularly preferably from 2 to 4. Such a polyfluoroalkylethylene may, for example, be specifically $CF_3CF_2CH$=$CH_2$ (hereinafter sometimes referred to as "PTFE"), $CF_3(CF_2)_3CH$=$CH_2$, $CF_3(CF_2)_5CH$=$CH_2$, $CF_3CF_2CF_2CF$=$CH_2$ or $CF_2HCF_2CF_2CF$=$CH_2$.

The perfluorovinyl ether may, for example, be specifically perfluoro(methyl vinyl ether), perfluoro(ethyl vinyl ether), perfluoro(propyl vinyl ether) (hereinafter sometimes referred to as "PPVE"), $CF_2$=$CFOCF_2CF(CF_3)O(CF_2)_2CF_3$, $CF_2$=$CFO(CF_2)_3O(CF_2)_2CF_3$, $CF_2$=$CFO(CF_2CF(CF_3)O)_2(CF_2)_2CF_3$, $CF_2$=$CFOCF_2CF_2OCF_2CF_3$ or $CF_2$=$CFO(CF_2CF_2O)_2CF_2CF_3$.

The perfluorovinyl ether is preferably a perfluoroalkyl vinyl ether.

The fluorinated monomer is preferably a fluoroethylene, a perfluoroolefin, a polyfluoroalkylethylene or a perfluorovinyl ether, particularly preferably TFE, HFP, PFEE, $CF_3(CF_2)_3CH$=$CH_2$, PPVE.

One type or two or more types of such fluororesin units may be used.

The fluororesin in the present invention may contain units having no fluorine atom (hereinafter sometimes referred to as "non-fluorinated units"). The non-fluorinated units are units derived from a monomer having no fluorine atom (hereinafter sometimes referred to as "a non-fluorinated monomer"). The non-fluorinated monomer may, for example, be a $C_{2-5}$ olefin such as ethylene, propylene, butylene or isobutylene, a vinyl ester or a vinyl alcohol.

One type or two or more types of such non-fluorinated units may be used.

The fluororesin in the present invention has a content of the fluorinated units of preferably at least 20 mol %, more preferably at least 30 mol %, particularly preferably at least 45 mol % in 100 mol % of all the structural units. When the content is at least the lower limit, such a fluororesin is excellent in the solvent resistance, the low dielectric property, the low surface energy property, the non-adherence and the weather resistance.

The fluororesin in the present invention may, for example, be an ethylene/tetrafluoroethylene copolymer (ETFE), a polytetrafluoroethylene (PTFE), a tetrafluoroethylene/perfluoroalkyl vinyl ether copolymer (PFA), a tetrafluoroethylene/hexafluoropropylene copolymer (FEP), a polyvinylidene fluoride (PVDF), a polychlorotrifluoroethylene (PCTFE) or a chlorotrifluoroethylene/ethylene copolymer (ECTFE). Particularly preferred is an ETFE in view of excellent heat resistance and melt-processing property.

The ETFE in the present invention is a copolymer having units derived from TFE and units derived from ethylene (hereinafter sometimes referred to as "units derived from E"). The molar ratio of the units derived from TFE/the units derived from E in the ETFE is preferably from 20/80 to 80/20, more preferably from 30/70 to 70/30, particularly preferably from 40/60 to 60/40. The ETFE may contain units derived from another monomer in addition to the units derived from TFE and E. Such another monomer may be as described above.

The fluororesin of the present invention has a melt flow rate (hereinafter sometimes referred to as "Q value") of preferably from 0.01 to 1,000 mm$^3$/sec, more preferably from 0.1 to 500 mm$^3$/sec, particularly preferably from 1 to 200 mm$^3$/sec. The Q value is an index for the melt flowability of a fluororesin and is an index for the molecular weight. A large Q value indicates a low molecular weight, and a small Q value indicates a high molecular weight. The Q value is a rate of extrusion of a fluororesin when extruded into an orifice having a diameter of 2.1 mm and a length of 8 mm under a load of 7 kg at a temperature higher by 50° C. than the melting point of the resin, as measured by a flow tester manufactured by Shimadzu Corporation. The melting point of the fluororesin is a value obtained from an endothermic peak when the resin is heated in an air atmosphere at 10° C./min up to 300° C. by a differential scanning calorimetry method (DSC method). When the Q value of the fluororesin is within the above range, the fluororesin is excellent in the extrusion property and the mechanical strength.

In the present invention, the fluororesins may be used alone or as a mixture of two or more.

<Introduction of Hydroxy Group>

As a method for introducing a hydroxy group to the side chain of the fluororesin, a conventional method may be employed, and a method of copolymerizing a monomer having a hydroxy group, or a method of copolymerizing a monomer having an ester bond or an ether bond and reacting the ester bond or the ether bond to convert it to a hydroxy group may be mentioned.

As a method for introducing a hydroxy group to the terminal of the fluororesin, a known method may be employed, and a method of using, at the time of polymerizing a monomer constituting the fluororesin, a hydroxy group-containing compound for the initiator or the chain transfer agent, may be mentioned. It is preferred to use a hydroxy group-containing compound as a chain transfer agent, whereby the amount of introduction of the hydroxy group will readily be adjusted. The chain transfer agent may, for example, be an alcohol such as methanol, ethanol, n-propanol, isopropanol or 2-butanol, and preferred is methanol which has a low molecular weight and which is excellent in the thermal stability. The amount of the alcohol is, for example, in a case where a monomer constituting the fluororesin is polymerized in a polymerization medium, preferably from 0.01 to 50 mass %, more preferably from 0.02 to 40 mass %, particularly preferably from 0.05 to 20 mass % based on the sum (100 mass %) of the polymerization medium and the alcohol. As a method for producing the ETFE, for example, a method as disclosed in JP-A-6-298809 may be mentioned.

<Introduction of Carbonyl Group>

The fluororesin having a carbonyl group may be a fluororesin having a group containing a carbonyl group (—C(=O)—) in its structure. The group containing a carbonyl group in its structure may, for example, be a group containing a carbonyl group between carbon atoms of a hydrocarbon group, a carbonate group, a carboxy group, a haloformyl group, an alkoxycarbonyl group or an acid anhydride residue.

The hydrocarbon group may, for example, be a $C_{2-8}$ alkylene group. The number of carbon atoms in the alkylene group is the number of carbon atoms in a state where no carbonyl group is contained. The alkylene group may be linear or branched.

The haloformyl group is represented by —C(=O)—X$^2$ (wherein X$^2$ is a halogen atom). X$^2$ is preferably a fluorine atom or a chlorine atom, particularly preferably a fluorine atom.

The alkoxy group in the alkoxycarbonyl group may be linear or branched, and is preferably a $C_{1-8}$ alkoxy group, particularly preferably a methoxy group or an ethoxy group.

As a method for introducing a carbonyl group to the side chain of the fluororesin, a known method may be employed, and a method of copolymerizing a fluorinated monomer and a monomer having a carbonyl group, or a method of copolymerizing a fluorinated monomer, a non-fluorinated monomer and a monomer having a carbonyl group may, for example, be mentioned.

The monomer having a carbonyl group may be a cyclic hydrocarbon monomer having a carbonyl group and having a polymerizable unsaturated group in its ring, and is preferably a polymerizable compound which is a cyclic hydrocarbon comprising at least one 5-membered or 6-membered ring and which has a dicarboxylic anhydride group and an endocyclic polymerizable unsaturated group, in view of excellent polymerizability.

The cyclic hydrocarbon is preferably a cyclic hydrocarbon having at least one bridged polycyclic structure. That is, preferred is a cyclic hydrocarbon comprising a non-condensed bridged polycyclic structure, a cyclic hydrocarbon having at least two bridged polycyclic structures condensed, or a cyclic hydrocarbon having a bridged polycyclic structure and another cyclic structure condensed.

The cyclic hydrocarbon monomer has at least one endocyclic polymerizable unsaturated group i.e. a polymerizable unsaturated group present between carbon atoms constituting a hydrocarbon ring.

The cyclic hydrocarbon monomer further has a dicarboxylic anhydride group (—CO—O—CO—). The dicarboxylic anhydride group may be bonded to two carbon atoms constituting the hydrocarbon ring or may be bonded to two carbon atoms out of the ring. It is preferred that the dicarboxylic anhydride group is bonded to two adjacent carbon atoms which are carbon atoms constituting the ring of the cyclic hydrocarbon. Further, carbon atoms constituting the ring of the cyclic hydrocarbon may have a halogen atom, an alkyl group, a halogenated alkyl group or another substituent bonded instead of the hydrogen atom.

As specific examples of the cyclic hydrocarbon monomer, compounds represented by the following formulae (1) to (8) and maleic anhydride may be mentioned. In the formulae (2)

and (5) to (8), R is a 1-6 lower alkyl group, a halogen atom selected from a fluorine atom, a chlorine atom, a bromine atom and an iodine atom, or a halogenated alkyl group having a hydrogen atom in the lower alkyl group substituted with a halogen atom.

Among them, the cyclic hydrocarbon monomer is preferably at least one member selected from the group consisting of itaconic anhydride (hereinafter sometimes referred to as "IAH"), citraconic anhydride (hereinafter sometimes referred to as "CAH") and 5-norbornene-2,3-dicarboxylic anhydride (hereinafter sometimes referred to as "NAH"). By using at least one member selected from the group consisting of IAH, CAH and NAH, the fluororesin in the present invention containing an acid anhydride residue will readily be produced without employing a specific polymerization method (JP-A-11-193312) which is required when maleic anhydride is employed.

The fluororesin having a carbonyl group in the present invention is preferably the following fluorinated copolymer (A1) or fluorinated copolymer (A2).

Fluorinated copolymer (A1): a copolymer having units derived from TFE and/or CTFE, units derived from the cyclic hydrocarbon monomer and units derived from a fluorinated monomer (excluding TFE and CTFE).

Fluorinated copolymer (A2): a copolymer having units derived from TFE and/or CTFE, units derived from the cyclic hydrocarbon monomer and units derived from a non-fluorinated monomer (excluding the cyclic hydrocarbon monomer).

As preferred specific examples of the fluorinated copolymer (A1), a TFE/PPVE/NAH copolymer, a TFE/PPVE/IAH copolymer, a TFE/PPVE/CAH copolymer, a TFE/HFP/NAH copolymer, a TFE/HFP/IAH copolymer, a TFE/HFP/CAH copolymer, a TFE/VdF/IAH copolymer, a TFE/VdF/CAH copolymer and a TFE/PPVE/HFP/NAH copolymer may be mentioned.

As preferred specific example of fluorinated copolymer (A2), a TFE/CH$_2$=CH(CF$_2$)$_4$F/NAH/E copolymer, a TFE/CH$_2$=CH(CF$_2$)$_4$F/IAH/E copolymer, a TFE/CH$_2$=CH(CF$_2$)$_4$F/CAH/E copolymer, a TFE/CH$_2$=CH(CF$_2$)$_2$F/NAH/E copolymer, a TFE/PFEE/IAH/E copolymer, a TFE/PFEE/CAH/E copolymer, a CTFE/CH$_2$=CH(CF$_2$)$_4$F/NAH/E copolymer, a CTFE/CH$_2$=CH(CF$_2$)$_4$F/IAH/E copolymer, a CTFE/CH$_2$=CH(CF$_2$)$_4$F/CAH/E copolymer, a CTFE/PFEE/NAH/E copolymer, a CTFE/PFEE/IAH/E copolymer and a CTFE/PFEE/CAH/E copolymer may be mentioned.

(Ester Bond-Containing Resin)

The present invention is considered to be applicable with an ester bond-containing resin from the principle of transesterification. The ester bond-containing resin is not limited so long as it is a resin having an ester bond moiety, and specifically, it may be a polyester resin, a polycarbonate resin or a polyarylate resin, and in view of excellent heat resistance, forming property and mechanical strength, it is preferably a polyester resin or a polycarbonate resin, particularly preferably a polycarbonate resin. In the present invention, the ester bond-containing resins may be used alone or as a mixture of two or more.

(Polyester Resin)

The polyester resin may be obtained, for example, by dehydration condensation of a dicarboxylic acid and a diol or dehydration condensation of a hydroxycarboxylic acid.

The polyester resin may, for example, be polylactic acid, a polyethylene terephthalate (PET) resin, a polybutylene terephthalate (PBT) resin, a polycyclohexane dim ethylene terephthalate (PCT) resin, a polybutylene naphthalate (PBN) resin or a polyethylene naphthalate (PEN), and in view of excellent heat resistance and forming property, it is preferably PET, PBT, PCT, PBN or PEN, particularly preferably PET, PBT or PCT. The melting point of the polyester resin may be from 180 to 280° C., and is preferably from 200 to 270° C., particularly preferably from 220 to 260° C., in view of excellent forming property and heat resistance.

The polyester resins may be used alone or as a mixture of two or more.

(Polycarbonate Resin)

The polycarbonate resin may be obtained, for example, by interfacial polycondensation of a dihydric phenol and a carbonylation agent, or melt transesterification.

The dihydric phenol may, for example, be hydroquinone, resorcinol, 4,4'-dihydroxydiphenyl, bis(4-hydroxyphenyl) methane, bis[(4-hydroxy-3,5-dimethyl)phenyl]methane, 1,1-bis(4-hydroxyphenyl)ethane, 1,1-bis(4-hydroxyphenyl)-1-phenylethane, 2,2-bis(4-hydroxyphenyl)propane(bisphenol A), 2,2-bis[(4-hydroxy-3-methyl)phenyl]propane, 2,2-bis[(4-hydroxy-3,5-dimethyl)phenyl]propane, 2,2-bis[(4-hydroxy-3,5-dibromo)phenyl]propane, 2,2-bis[(3-isopropyl-4-hydroxy)phenyl]propane, 2,2-bis[(4-hydroxy-3-phenyl)phenyl]propane, 2,2-bis(4-hydroxyphenyl)butane, 2,2-bis(4-hydroxyphenyl)-3-methylbutane, 2,2-bis(4-hydroxyphenyl)-3,3-dimethylbutane, 2,4-bis(4-hydroxyphenyl)-2-methylbutane, 2,2-bis(4-hydroxyphenyl)pentane, 2,2-bis(4-hydroxyphenyl)-4-methylpentane, 1,1-bis(4-hydroxyphenyl)cyclohexane, 1,1-bis(4-hydroxyphenyl)-4-isopropylcyclohexane, 1,1-bis(4-hydroxyphenyl)-3,3,5-trimethylcyclohexane, 9,9-bis(4-hydroxyphenyl)fluorene, 9,9-bis[(4-hydroxy-3-methyl)phenyl]fluorene, α,α'-bis(4-hydroxyphenyl)-o-diisopropylbenzene, α,α'-bis(4-hydroxyphenyl)-m-diisopropylbenzene, α,α'-bis(4-hydroxyphenyl)-p-diisopropylbenzene, 1,3-bis(4-hydroxyphenyl)-5,7-dimethyladamantane, 4,4'-dihydroxydiphenyl sulfone, 4,4'-dihydroxydiphenyl sulfoxide, 4,4'-dihydroxydiphenyl sulfide, 4,4'-dihydroxydiphenyl ketone, 4,4'-dihydroxydiphenyl ether or 4,4'-dihydroxyphenyl ester.

In view of availability, bisphenol A is preferred.

The carbonylation agent may, for example, be a carbonyl halide such as phosgene, a carbonate ester such as diphenyl carbonate or a haloformate such as dihaloformate of a dihydric phenol.

As a method for producing the polycarbonate resin, in addition to the interfacial polycondensation or the melt transesterification, solid phase transesterification of a carbonate as a prepolymer, or a ring-opening polymerization of a cyclic carbonate may be mentioned.

The mass average molecular weight of the polycarbonate resin is, in view of excellent mechanical properties and forming property, preferably from 10,000 to 300,000, more preferably from 30,000 to 200,000, particularly preferably from 30,000 to 100,000. The mass average molecular weight is a value measured by gel permeation chromatography (GPC).

As a polycarbonate resin, commercial products may be used. For example, Lexan (manufactured by SABIC Innovative Plastics), Makrolon and Apec (manufactured by Bayer), Hiloy (manufactured by ComAlloy), Calibre (manufactured by Sumika Styron Polycarbonate Limited), Lupilonx (manufactured by Mitsubishi Engineering-Plastic Corporation), Naxell (manufactured by MRC Polymers), Edgetek (manufactured by PolyOne), Trirex (manufactured by Sam Yang Kasei Co., Ltd.) and Panlite (manufactured by TEIJIN LIMITED) may be mentioned.

The polycarbonate resins may be used alone or as a mixture of two or more.

(Transesterification Catalyst)

The transesterification catalyst in the present invention may be a metal, an organic acid salt of a metal, an inorganic acid salt of a metal, an oxide of a metal, a hydroxide of a metal, a halide of a metal, a sulfur-containing oxoacid or a nitrogen-containing basic compound.

The metal may, for example, be zinc, iron, calcium, magnesium, sodium, tin, manganese, aluminum, cerium, barium, cobalt, potassium, cesium, lead, strontium or antimony.

As the metal of the organic acid salt of a metal, the inorganic acid salt of a metal, the oxide of a metal, the hydroxide of a metal and the halide of a metal, the above metal may be mentioned.

The organic acid salt may be a carboxylate, and the inorganic acid salt may, for example, be a carbonate, a nitrate, a phosphate or a borate.

The halide may, for example, be a fluoride, a chloride or a bromide.

The sulfur-containing oxoacid may, for example, be sulfuric acid, sulfonic acid, sulfinic acid or sulfenic acid.

The nitrogen-containing basic compound may be a quaternary ammonium salt, a tertiary amine, a secondary amine, a primary amine, a pyridine, an imidazole or an ammonia.

The transesterification catalyst in the present invention is preferably a metal salt of an organic acid, a metal salt of carbonic acid, a metal oxide or a metal hydroxide, which is excellent in dispersibility in the resin and thermal stability and which is less likely to bleed out when the resin composition is melt-kneaded. Preferred is an organic acid salt (such as a carboxylate), a carbonate, an oxide or a hydroxide of magnesium, zinc or calcium, since it has low moisture absorbance and deliquescence property, whereby bubbling of a molding product due to inclusion of moisture can be avoided, and more preferred is a carboxylate of zinc, a carboxylate of magnesium, zinc carbonate, magnesium carbonate, zinc oxide, magnesium oxide, zinc hydroxide or magnesium hydroxide, particularly preferred is magnesium hydroxide, magnesium oxide or zinc oxide.

The shape of the transesterification catalyst in the present invention is not particularly limited. In the case of particles, for example, spheres, agglomerates or needles may, for example, be employed. The particle size or axial length is preferably a certain size or smaller, in order to secure excellent forming property of the resin composition or the melt-kneaded product and to avoid stress defects after film formation. In the case of spheres or agglomerates, the average particle size is preferably from 0.01 to 10 μm, particularly preferably from 0.01 to 3 μm. In the case of needles, the average axial length is preferably from 0.01 to 10 μm, particularly preferably from 0.1 to 5 μm. The average particle size and the average axial length are values measured by a scanning electron microscope (SEM).

In the present invention, the transesterification catalysts may be used alone or as a mixture of two or more.

(Optional Components)

The resin composition of the present invention may contain, within a range not to impair the effects of the present invention, optional components such as a pigment, an ultraviolet absorber, a photostabilizer, a surface modifier, a pigment dispersing agent, a flame retardant, a plasticizer, a filler, a thickener, an adhesion-improving agent and a delustering agent.

(Blend Ratio)

In the resin composition of the present invention, the mass ratio of the fluororesin to the ester bond-containing resin (the mass of the fluororesin/the mass of the ester bond-containing resin) is preferably from 50/50 to 99.9/0.1, more preferably from 55/45 to 99.9/0.1, particularly preferably from 65/35 to 99.9/0.1. Within the above range, in the molding product, a micro-phase separation structure (sea-island structure) in which the fluororesin constitutes a continuous phase (so-called "sea") and the ester bond-containing resin constitutes a dispersed phase (so-called "island") tends to be formed.

In the resin composition of the present invention, the volume ratio of the fluororesin to the ester bond-containing resin (the volume of the fluororesin/the volume of the ester bond-containing resin) is preferably from 40/60 to 99.9/0.1, more preferably from 50/50 to 99.9/0.1, particularly preferably from 60/40 to 99.9/0.1. Within the above range, in the molding product, a micro-phase separation structure in which the fluororesin constitutes a continuous phase and the ester bond-containing resin constitutes a dispersed phase, tends to be formed.

The content of the transesterification catalyst in the resin composition of the present invention is preferably from 0.001 to 20 parts by mass, more preferably from 0.005 to 15 parts by mass, particularly preferably from 0.01 to 10 parts by mass per 100 parts by mass of the sum of the fluororesin, the ester bond-containing resin and the transesterification catalyst. When the content of the transesterification catalyst is at least the lower limit of the above range, transesterification will sufficiently proceed when the fluororesin, the ester bond-containing resin and the transesterification catalyst are melt-kneaded, and when it is at most the upper limit, the ester bond-containing resin is less likely to decompose.

[Molding Compound]

The resin composition of the present invention may be used as it is for melt-processing as a molding compound (hereinafter sometimes referred to as "a molding compound"). Otherwise, the resin composition of the present invention may be melt-kneaded and cooled to obtain a molding compound, which is used for melt-processing. The molding compound produced by melt-kneading and cooling the resin composition of the present invention will sometimes be referred to as a melt-kneaded product.

The resin composition for molding may be a composition in the form of a powder obtained by mixing the respective components of the resin composition, or may be particles or the like obtained by granulating the resin composition. The melt-kneaded product may be pellets, agglomerates or the like obtained by melt-kneading the resin composition, or may be a powder or the like obtained by cooling and pulverizing the melt-kneaded product.

The micro-phase separation structure in the molding product is obtained by melt-processing of the molding compound and subsequent cooling. The micro-phase separation structure may not be present at the stage of the molding compound, or may be present at the stage of the molding compound. In the resin composition for molding, even when it is produced via melting procedure, substantially no micro-phase separation structure is considered to be present if the molding compound is not kneaded. On the other hand, a melt-kneaded product is considered to have a micro-phase separation structure to a certain extent or more.

From the resin composition for molding considered to have substantially no micro-phase separation structure, a molding product consisting of a resin having a micro-phase separation structure can be produced by a melt-processing method via the melt-kneading procedure. The melt-processing method via the melt-kneading procedure may, for example, be extrusion or injection molding.

From a melt-kneaded product which is considered to have a micro-phase separation structure, a molding product consisting of a resin having a micro-phase separation structure can be produced not only by melt-processing method via the melt-kneading process but also by melt-processing without the melt-kneading process or with insufficient melt-kneading process. The melt-processing method without the melt-kneading procedure or with insufficient melt-kneading process may, for example, be a melt compression molding method, a melt cast molding method or a transfer molding method.

The molding compound in the present invention is preferably a melt-kneaded product having a micro-phase separation structure obtained by melt-kneading the resin composition of the present invention. The melt-kneaded product having a micro-phase separation structure may be used as a molding compound applicable to the melt-processing method without the melt-kneading process or with insufficient melt-kneading process, and its application is not limited to extrusion or injection molding.

(Melt-Kneaded Product)

To produce a molding product consisting of a resin having a micro-phase separation structure, it is preferred to use a molding material obtained by melt-kneading and cooling the resin composition of the present invention. For example, the resin composition of the present invention is melt-kneaded and extruded into a strand, and the strand is cut and cooled to obtain a forming material in the form of pellets.

It is considered that in the melt-kneaded product, by melt-kneading the fluororesin and the ester bond-containing resin in the presence of the transesterification catalyst, a hydroxy group or a carbonyl group in a part of the fluororesin and an ester bond in a part of the ester bond-containing resin undergo transesterification to form a reaction product. And, it is considered that the reaction product functions as a compatibilizing agent between the fluororesin and the ester bond-containing resin. As a result, it is considered that in a molding product obtained by using the melt-kneaded product, a micro-phase separation structure in which the continuous phase consists of the fluororesin and the dispersed phase consists of the ester bond-containing resin is more likely to form, and a morphology such that the islands in the sea-island structure are thinly and uniformly dispersed is likely to form. Accordingly, it is considered that the compatibility between the resins will more improve and thus a molding product excellent in the mechanical strength and the elongation will be obtained.

<Melt-Kneading Temperature and Time>

The melt-kneading temperature of the fluororesin, the ester bond-containing resin and the transesterification catalyst is preferably from 260 to 300° C., particularly preferably from 270 to 280° C. When it is at least the lower limit of the above range, the resin composition will readily be melt-kneaded, and when it is at most the upper limit, the resins are less likely to decompose by heat. The melt-kneading time is preferably from 5 to 60 minutes, particularly preferably from 5 to 30 minutes. When it is at most the upper limit of the above range, the resins are less likely to decompose by heat.

<Master Batch Method>

The melt-kneaded product of the present invention may be formed into a molding product by a method of using the melt-kneaded product as a master batch and blending the master batch with the fluororesin and the ester bond-containing resin, followed by melt-processing.

Since a master batch has a high concentration of the transesterification catalyst, the transesterification will sufficiently proceed and a reaction product can be obtained efficiently. Accordingly, the compatibility of the resins in the obtainable molding product will improve.

The concentration of the transesterification catalyst in the master batch is preferably from 0.1 to 30 mass %, more preferably from 0.5 to 30 mass %, particularly preferably from 1 to 25 mass % per 100 mass % of the sum of the fluororesin and the ester bond-containing resin in the master batch. Within the above range, the transesterification will sufficiently proceed.

The mass ratio of the fluororesin to the ester bond-containing resin in the master batch and the mass ratio of the fluororesin to the ester bond-containing resin to be added later may be the same or different, however, they are preferably the same so as to obtain a uniform composition. The mass ratio of the fluororesin to the ester bond-containing resin in the master batch (the mass of the fluororesin/the mass of the ester bond-containing resin) is preferably from 50/50 to 99.9/01, more preferably from 55/45 to 99.9/0.1, particularly preferably from 65/35 to 99.9/0.1 The mass ratio of the amount of the master batch to the total amount of the fluororesin and the ester bond-containing resin to be added later is preferably from 0.1/99.9 to 50/50, particularly preferably from 1/99 to 20/80. Within the above range, the compatibility of the resins in the obtainable molding product will improve.

The melt-kneading temperature when the master batch is produced is preferably from 260 to 300° C., particularly preferably from 270 to 280° C. When it is at least the lower limit of the above range, melt-kneading will easily be conducted, and when it is at most the upper limit, the resins are less likely to decompose by heat. The melt-kneading time is preferably from 1 to 60 minutes, more preferably from 1 to 30 minutes, particularly preferably from 1 to 10 minutes. When it is at most the upper limit of the above range, the resins are less likely to decompose by heat.

The temperature at which the master batch is blended with the rest of the fluororesin and the ester bond-containing resin and the mixture is melt-kneaded, is preferably from 260 to 300° C., particularly preferably from 260 to 280° C. The time is preferably from 5 to 60 minutes, more preferably from 5 to 30 minutes, particularly preferably from 10 to 30 minutes.

(Morphology)

The sea-island structure in the molding product of the present invention may be confirmed by observation with an electron microscope of a cut surface in a diameter direction of a strand extruded from a die hole with L/D (L is the hole length and D is the hole diameter) of 10 and a diameter of 1 mm at a rate of 10 mm/min after preheating at the same temperature as the kneading temperature for 10 minutes, by means of a capirograph. In the molding product of the present invention, preferred is a sea-island structure with from 0.1 to 1 island/$\mu m^2$. The density of the island in the sea-island structure is particularly preferably from 0.2 to 1 island/$\mu m^2$, with a view to forming a molding product excellent in the mechanical strength and the elongation.

[Molding Product]

The molding product of the present invention may be produced by melt-processing the resin composition or the melt-kneaded product as the molding compound.

The shape of the molding product is not particularly limited, and is preferably a film or a sheet (hereinafter sometimes referred to as "film or the like"). In the present invention, the film or the like means a molding product having a substantially constant thickness. The film is one having a thickness of 0.2 mm or thinner, and a sheet is one having a thickness exceeding 0.2 mm. However, the film or the like in common names such as a backsheet for a solar cell is not necessarily limited to the above thickness.

The thickness of the film or the like in the present invention is preferably from 1 to 800 μm, more preferably from 5 to 500 μm.

The film or the like is applicable to an agricultural film, a solar cell backsheet, etc. for which weather resistance is required. In a case where it is used for a solar cell backsheet, the film of the present invention is preferably used as an outermost layer. The thickness of the film of the present invention is suitably from 10 to 100 μm. Within such a range, the film is available at a low cost and is excellent in the mechanical strength, the weather resistance, the light ray shielding property (easiness of blending of a light ray-shielding pigment) etc. which are required for a solar cell backsheet or the like.

(Melt-Processing Conditions)

The melt-processing method is not particularly limited and may be extrusion, blown-film inflation or injection molding. The melt-processing temperature is preferably from 260 to 280° C., particularly preferably from 270 to 280° C. The forming time is preferably from 1 to 60 minutes, more preferably from 1 to 30 minutes, particularly preferably from 5 to 30 minutes, whereby the resins are less likely to decompose.

(Laminated Product)

The molding product of the present invention may form a laminated product as disposed between a fluororesin film or sheet (hereinafter sometimes referred to as "a fluororesin film or the like") and an ester bond-containing resin film or sheet (hereinafter sometime referred to as an ester bond-containing resin film or the like). By using the molding product of the present invention between the fluororesin film or the like and the ester bond-containing resin film or the like, the adhesion between which is insufficient, the adhesion between the fluororesin film or the like and the ester bond-containing resin film or the like will improve by the molding product functioning as an adhesive layer.

The fluororesin film or the like is preferably a film of an ethylene/tetrafluoroethylene copolymer in view of the forming property. The thickness of the fluororesin film or the like is preferably from 1 to 800 μm, particularly preferably from 5 to 500 μm.

The thickness of the ester bond-containing resin film or the like is preferably from 100 μm to 100,000 μm, particularly preferably from 300 to 20,000 μm. The ester bond-containing resin film or the like is preferably a film of a polycarbonate resin.

On the opposite side of each of the fluororesin film or the like and the ester bond-containing resin film or the like from the molding product of the present invention, another film or the like may further be laminated.

The adhesion between the fluororesin film or the like and the ester bond-containing resin film or the like in the laminated product of the present invention is considered to develop by contact of the micro-phase separated resin phases in the molding product of the present invention disposed therebetween to the films or the like more compatible therewith. The degree of phase separation in the molding product may be controlled by adjusting the volume ratio of the resin components, the thicknesses of the layers, the melt flowability of the resin components, the melt-processing temperature, the melt-processing time, etc. In general, if the volumes of the resin components in the blended resin are at the same level, phase separation is more likely to occur. The molding product in the laminated product of the present invention has a volume ratio (the volume of the fluororesin/the volume of the ester bond-containing resin) of preferably from 45/55 to 55/45, more preferably 50/50, with a view to improving the adhesion.

The layer of the molding product in the laminated product of the present invention has a thickness of preferably from 10 to 1,000 µm, more preferably from 25 to 500 µm, particularly preferably from 25 to 200 µm in view of excellent adhesion and cost.

The laminated product in the present invention may be obtained by sandwiching the molding product between the fluororesin film or the like and the ester bond-containing resin film or the like, setting the sandwich into a pressing machine heated to from 260 to 300° C., compression molding it under a contact pressure of from 0.01 to 10 MPa, cooling it under a pressure of from 0.01 to 10 MPa, and taking it out from the pressing machine. As the case requires, an optional film or sheet is overlaid on the side of the fluororesin film or the like and/or the side of the ester bond-containing resin film or the like, followed by the above heating and pressurization to produce a laminated product having at least four-layered structure further having a layer of a resin or the like on one or both sides of the above laminated product having a three-layered structure.

Further, the molding compound of the present invention, the fluororesin and the ester bond-containing resin may be co-extruded to produce the above laminated product having a three-layered structure, or an optional melt-processable resin may further be used to produce the above laminated product having at least four-layered structure.

The laminated product of the present invention has controlled antifouling property, chemical resistance and weather resistance, and is suitably used for an interior material in e.g. a kitchen, an exterior material of e.g. eaves, or a building material for the exterior.

EXAMPLES

Now, the present invention will be described in further detail with reference to Examples. However, it should be understood that the present invention is by no means restricted to such specific Examples. Ex. 2, 4, 8 to 19, 21, 24, 25, 27 to 30 are Examples of the present invention, and Ex. 1, 3, 5 to 7, 20, 22, 23 and 26 are Comparative Examples.

Components in Tables 1 to 4 are as follows.

Ethylene/Tetrafluoroethylene Copolymer (ETFE)

ETFE-1: an ETFE having a hydroxy group prepared with reference to Example 1 in WO2008/069278 (provided that the amount of methanol charged was 7.70 kg).

Units derived from TFE/E/(perfluorobutyl)ethylene: 54.2/44.1/1.7 (molar ratio). Q value: 211 mm$^3$/sec, terminal OH amount (the number of terminal OH groups per $10^6$ carbon atoms): 740, melting point: 245° C.

ETFE-2: an ETFE having no hydroxy group, prepared with reference to Comparative Example 1 in WO2008/069278.

Units derived from TFE/E/(perfluorobutyl)ethylene: 54.4/44.2/1.4 (molar ratio), Q value: 40 mm$^3$/sec, terminal OH amount (the number of terminal OH groups per $10^6$ carbon atoms): 0, melting point: 257° C.

ETFE-3: an ETFE having a hydroxy group prepared with reference to Example 1 in WO2008/069278.

Units derived from TFE/E/(perfluorobutyl)ethylene: 54.2/44.1/1.7 (molar ratio), Q value: 44 mm$^3$/sec, terminal OH amount (the number of terminal OH groups per $10^6$ carbon atoms): 460, melting point: 255° C.

ETFE-4: an ETFE having a carbonyl group obtained in the after-mentioned Preparation Example 1.

Units derived from TFE/E/PFEE ($CF_3CF_2CH\!\!=\!\!CH_2$)/IAH: 58.2/38.4/3.1/0.3 (molar ratio), Q value: 25.6 mm$^3$/sec, terminal OH amount (the number of terminal OH groups per $10^6$ carbon atoms): undetectable, melting point: 221° C.

ETFE-5: an ETFE obtained by the after-mentioned Preparation Example 2.

Units derived from TFE/E/PFEE: 53.7/45.6/0.7 (molar ratio), Q value: 38.1 mm$^3$/sec, terminal OH amount (the number of terminal OH groups per $10^6$ carbon atoms): undetectable, melting point: 255° C.

ETFE-6: a mixture of ETFE-4 and ETFE-5 obtained in the after-mentioned Preparation Example 3.

Q value: 21.3 mm$^3$/sec, terminal OH amount (the number of OH groups per $10^6$ carbon atoms): undetectable, melting point: 235° C.

In the above, the Q value is a rate of extrusion of the fluororesin extruded into an orifice having a diameter of 2.1 mm and a length of 8 mm under a load of 7 kg at a temperature higher by 50° C. than the melting point of each resin, as measured by a flow tester manufactured by Shimadzu Corporation. Further, the melting point is a value obtained from an endothermic peak when the resin is heated in an air atmosphere at 10° C./min up to 300° C., by a differential scanning calorimetry method (DSC method).

Further, the compositional ratio is a value obtained from the results of melt NMR analysis and infrared spectrum analysis.

Polycarbonate Resin (PC)

PC-1: Calibre 301-10 manufactured by Sumika Styron Polycarbonate Limited

Mass average molecular weight: 55,000 (as calculated as polystyrene measured by GPC). Melt volume rate: 10 cm$^3$/10 min. measurement conditions: 300° C./1.2 kg).

PC-2: Calibre 200-3 manufactured by Sumika Styron Polycarbonate Limited

Mass average molecular weight: 77,000 (as calculated as polystyrene measured by GPC). Melt volume rate: 3 cm$^3$/10 min (measurement conditions: 300° C./1.2 kg).

Transesterification Catalyst

C-1: magnesium hydroxide: MGZ-1 manufactured by SAKAI CHEMICAL INDUSTRY CO., LTD., average particle size: 0.8 µm C-2: magnesium hydroxide: MGZ-3 manufactured by SAKAI CHEMICAL INDUSTRY CO., LTD., average particle size: 0.1 µm C-3: magnesium hydroxide: MAGSEEDS S-6 manufactured by Konoshima Chemical Co., Ltd., average particle size: 1.0 µm C-4: magnesium hydroxide: SMO-2 manufactured by SAKAI CHEMICAL INDUSTRY CO., LTD., average particle size: 2 µm C-5: zinc oxide: NZ-LARGE manufactured by SAKAI CHEMICAL INDUSTRY CO., LTD., average axial length: 1.0 µm C-6: zinc oxide: Finex 30 manufactured by SAKAI CHEMICAL INDUSTRY CO., LTD., average particle size: 35 nm Further, the specific gravities of the respective components are as follows.

ETFE: 1.75 g/cm$^3$, polycarbonate resin: 1.2 g/cm$^3$, magnesium hydroxide: 2.36 g/cm$^3$, magnesium oxide: 3.65 g/cm$^3$, zinc oxide: 5.61 g/cm$^3$.

Preparation Example 1: Preparation of ETFE-4

A stainless steel polymerization tank having an internal capacity of 94 L equipped with a stirring apparatus was deaerated, 69.7 kg of (perfluoropentyl)difluoromethane, 22.3 kg of 1,3-dichloro-1,1,2,2,3-pentafluoropropane (AK225cb, manufactured by Asahi Glass Company, Limited) (hereinafter sometimes referred to as "AK225cb"), 528 g of PFEE, 13.3 kg of TFE and 456 g of E were injected, and the temperature in the polymerization tank was increased to 66° C. On that occasion, the pressure was 1.49 MPa/G. 19 g of tert-butyl peroxypivalate as a polymerization initiator was charged to initiate polymerization. A monomer mixture gas of TFE/E=60/40 by molar ratio was continuously charged so that the pressure would be constant during polymerization. Further, PFEE in an amount corresponding to 3 mol % based on the total number of moles of TFE and E to be charged during polymerization and itaconic anhydride (IAH) in an amount corresponding to 0.3 mol % were continuously charged. 5.6 Hours after initiation of polymerization, at a point when 11.5 kg of the monomer mixture gas was charged, the internal temperature of the polymerization tank was lowered to room temperature and the pressure in the polymerization tank was purged to normal pressure.

The obtained slurry was poured into a 300 L granulation tank in which 100 kg of water was charged and heated to 105° C. with stirring, and the solvent was removed by distillation for granulation. The obtained granules were dried at 135° C. for 3 hours to obtain 12.2 kg of granules of ETFE-4.

Preparation Example 2: Preparation of ETFE-5

A stainless steel polymerization tank having an internal capacity of 94 L equipped with a stirring apparatus was deaerated, 71.0 kg of (perfluoropentyl)difluoromethane, 27.3 kg of AK225cb, 150 g of PFEE, 12.6 kg of TFE and 752 g of E were injected, and the temperature in the polymerization tank was increased to 66° C. On that occasion, the pressure was 1.53 MPa/G. 9 g of tert-butyl peroxypivalate as a polymerization initiator was charged to initiate polymerization. A monomer mixture gas of TFE/E=51/46 by molar ratio was continuously charged so that the pressure would be constant during polymerization. Further, PFEE in an amount corresponding to 0.7 mol % based on the total number of moles of TFE and E to be charged during polymerization was continuously charged. 5.7 Hours after initiation of polymerization, at a point when 11.5 kg of the monomer mixture gas was charged, the internal temperature of the polymerization tank was lowered to room temperature and the pressure in the polymerization tank was purged to normal pressure.

Granulation was carried out in the same manner as in Preparation Example 1 except that the obtained slurry was used to obtain 12.5 kg of granules of ETFE-5.

Preparation Example 3: Preparation of ETFE-6

20 Parts by mass of ETFE-4 obtained in Preparation Example 1 and 80 parts by mass of ETFE-5 obtained in Preparation Example 2 were dry-blended, and melt-kneaded by a twin screw extruder at a temperature of 260° C. for a retention time of 2 minutes to obtain ETFE-6.

Ex. 1 to 30

(Preparation of Melt-Kneaded Product)

In Ex. 1 to 8, 10 to 11, 15, 22 to 25 and 28 to 30, a molding compound consisting of a melt-kneaded product was prepared as follows. The respective components were charged in a blend ratio as identified in Tables 1 to 3 into Labo Plastom ill mixer manufactured by Toyo Seiki Seisaku-sho, Ltd. set at from 270 to 280° C., pre-kneaded at a number of revolutions of 20 per minute for 1 minute, and then melt-kneaded at the kneading temperature for the kneading time as identified in Tables 1 to 3 at a number of revolutions of 50 per minute to obtain a melt-kneaded product.

In Ex 9, 12 to 14, 16 to 21 and 26 to 27, a melt-kneaded product was prepared as follows. The ETFE, the polycarbonate resin and the transesterification catalyst were charged so as to achieve the concentration of the catalyst in the master batch as identified in Tables 1 to 3 into Labo Plastomill mixer manufactured by Toyo Seiki Seisaku-sho, Ltd. set at from 270 to 280° C. Then, melt-kneading was carried out at a number of revolutions of 50 per minute at the master batch kneading temperature for the master batch kneading time as identified in Tables 1 to 3 to obtain a master batch. Then, the rest of the ETFE and the polycarbonate resin was charged, and melt-kneading was carried out at a number of revolutions 50 per minute at the kneading temperature for the kneading time as identified in Tables 1 to 3 to obtain a melt-kneaded product. The mass ratio of the ETFE to the polycarbonate resin in the master batch and the mass ratio of the ETFE to the polycarbonate resin as the rest are the same. Further, the concentration of the catalyst in the master batch is the amount (mass %) of the transesterification catalyst used for the master batch per 100 mass % of the sum of the ETFE, the polycarbonate resin and the transesterification catalyst in the master batch.

(Preparation of Molding Product)

The obtained melt-kneaded product was filled in a 100 mm square SUS316 mold having a thickness of 100 μm, the mold was set to a pressing machine (Mini Test Press MP-WCL) manufactured by Toyo Seiki Seisaku-sho, Ltd. set at from 270 to 280° C., and a SUS316 mirror plate of 150 mm×150 mm was used as a cover. The melt-kneaded product was preheated for 5 minutes, subjected to compression molding under a contact pressure of 8.7 MPa for 5 minutes and cooled under a contact pressure of 8.7 MPa for 5 minutes to obtain a film molding in the size of the mold and having a thickness of 100 μm.

(Tensile Test)

In accordance with ASTM D1822-L, a dumbbell was punched out from the obtained film using a Super Dumbbell Cutter (SDMK-100L manufactured by DUMBBELL CO., LTD.) and used as a test specimen. A tensile test was carried out at a rate of 10 mm/min by TENSILON universal testing instrument (manufactured by A&D Company Limited), and the maximum stress (MPa) and the elongation (%) with N (sample number) of from 5 to 8 were obtained. The results are shown in Tables 1 to 3.

(PCT Test)

In Ex. 7, 8, 14 and 28 to 30, the obtained film was held at 120° C. in a humidity supersaturation state for 168 hours in a PCT apparatus (EHS-411MD manufactured by ESPEC CORP.), and then the film was subjected to a tensile test in the same manner as above to obtain the maximum stress (MPa) and the elongation (%) with N (Sample number) of from 5 to 8. "Retention of elongation (%)" is the elongation after the PCT test/the elongation before the PCT test×100, and "retention of maximum stress (%)" is the maximum stress after the PCT test/the maximum stress before the PCT test×100.

The results are shown in Tables 1 to 3.

TABLE 1

|  |  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| ETFE (parts by mass) | ETFE-1 | 59.3 | 54.7 | 68.6 | 63.5 | — | — | — | — | — | — |
|  | ETFE-2 | — | — | — | — | 68.6 | 63.5 | — | — | — | — |
|  | ETFE-3 | — | — | — | — | — | — | 68.6 | 67.6 | 68.1 | 68.5 |
|  | ETFE-4 | — | — | — | — | — | — | — | — | — | — |
|  | ETFE-6 | — | — | — | — | — | — | — | — | — | — |
| PC (parts by mass) | PC-1 | 40.7 | 37.5 | 31.4 | 29.0 | — | — | — | — | — | — |
|  | PC-2 | — | — | — | — | 31.4 | 29.0 | 31.4 | 30.9 | 31.1 | 31.3 |
| Content (mass %) |  | 100.0 | 92.2 | 100.0 | 92.5 | 100.0 | 92.5 | 100.0 | 98.5 | 99.2 | 99.8 |
| Trans-esterification catalyst (parts by mass) | C-1 | — | 7.8 | — | 7.5 | — | 7.5 | — | 1.5 | 0.8 | — |
|  | C-2 | — | — | — | — | — | — | — | — | — | 0.2 |
|  | C-3 | — | — | — | — | — | — | — | — | — | — |
|  | C-4 | — | — | — | — | — | — | — | — | — | — |
|  | C-5 | — | — | — | — | — | — | — | — | — | — |
|  | C-6 | — | — | — | — | — | — | — | — | — | — |
| Sum (parts by mass) |  | 100.0 | 100.0 | 100.0 | 100.0 | 100.0 | 100.0 | 100.0 | 100.0 | 100.0 | 100.0 |
| ETFE/PC (mass ratio) |  | 59/41 | 59/41 | 69/31 | 69/31 | 69/31 | 69/31 | 69/31 | 69/31 | 69/31 | 69/31 |
| ETFE/PC (volume ratio) |  | 50/50 | 50/50 | 60/40 | 60/40 | 60/40 | 60/40 | 60/40 | 60/40 | 60/40 | 60/40 |
| Amount of components in master batch (parts by mass) | ETFE | — | — | — | — | — | — | — | — | 6.3 | — |
|  | PC | — | — | — | — | — | — | — | — | 2.8 | — |
|  | Catalyst | — | — | — | — | — | — | — | — | 0.8 | — |
|  | Total amount (X) | — | — | — | — | — | — | — | — | 9.9 | — |
| Concentration of catalyst in master batch (mass %) |  | — | — | — | — | — | — | — | — | 7.8 | — |
| Amount of components added later (parts by mass) | ETFE | — | — | — | — | — | — | — | — | 61.8 | — |
|  | PC | — | — | — | — | — | — | — | — | 28.3 | — |
|  | Total amount (Y) | — | — | — | — | — | — | — | — | 90.1 | — |
| X/Y (mass ratio) |  | — | — | — | — | — | — | — | — | 9.9/90.1 | — |
| Master batch kneading conditions | Kneading temp.(° C.) | — | — | — | — | — | — | — | — | 280 | — |
|  | Kneading time (min) | — | — | — | — | — | — | — | — | 5 | — |
| Kneading conditions | Kneading temp.(° C.) | 270 | 270 | 270 | 270 | 280 | 280 | 280 | 280 | 280 | 280 |
|  | Kneading time (min) | 20 | 20 | 10 | 10 | 5 | 5 | 25 | 25 | 25 | 25 |
| Evaluation of physical properties | Elongation (%) | 10.5 | 51.0 | 8.6 | 104.2 | 39.4 | 9.4 | 64.8 | 170.8 | 214.7 | 218.6 |
|  | Maximum stress (MPa) | 31.0 | 39.0 | 23.7 | 37.6 | 25.9 | 31.6 | 36.4 | 42.4 | 47.9 | 48.2 |
| PCT Test | Elongation (%) | — | — | — | — | — | — | 9.3 | 85.6 | — | — |
|  | Retention of elongation (%) | — | — | — | — | — | — | 14.3 | 50.4 | — | — |
|  | Maximum stress (MPa) | — | — | — | — | — | — | 27.5 | 39.8 | — | — |
|  | Retention of maximum stress (%) | — | — | — | — | — | — | 75.6 | 93.9 | — | — |

TABLE 2

|  |  | Ex. 11 | Ex. 12 | Ex. 13 | Ex. 14 | Ex. 15 | Ex. 16 | Ex. 17 | Ex. 18 | Ex. 19 | Ex. 20 |
|---|---|---|---|---|---|---|---|---|---|---|---|
| ETFE (parts by mass) | ETFE-1 | — | — | — | — | — | — | — | — | — | — |
|  | ETFE-2 | — | — | — | — | — | — | — | — | — | 68.6 |
|  | ETFE-3 | 67.6 | 67.8 | 68.3 | 68.0 | 67.4 | 67.4 | 68.6 | 68.6 | 68.6 | — |
|  | ETFE-4 | — | — | — | — | — | — | — | — | — | — |
|  | ETFE-6 | — | — | — | — | — | — | — | — | — | — |
| PC (parts by mass) | PC-1 | — | — | — | — | — | — | — | — | — | — |
|  | PC-2 | 30.9 | 31.0 | 31.3 | 31.1 | 30.8 | 30.8 | 31.4 | 31.4 | 31.4 | 31.4 |
| Content (mass %) |  | 98.5 | 98.8 | 99.6 | 99.1 | 98.2 | 98.2 | 100.0 | 100.0 | 100.0 | 100.0 |
| Trans-esterification catalyst (parts by mass) | C-1 | — | — | — | — | — | — | — | — | — | — |
|  | C-2 | — | — | — | — | — | — | — | — | — | — |
|  | C-3 | 1.5 | — | — | — | — | — | — | — | — | — |
|  | C-4 | — | 1.2 | — | — | — | — | — | — | — | — |
|  | C-5 | — | — | 0.4 | 0.9 | 1.8 | 1.8 | 0.037 | — | — | — |
|  | C-6 | — | — | — | — | — | — | — | 0.018 | 0.037 | 0.037 |
| Sum (parts by mass) |  | 100.0 | 100.0 | 100.0 | 100.0 | 100.0 | 100.0 | 100.0 | 100.0 | 100.0 | 100.0 |
| ETFE/PC (mass ratio) |  | 69/31 | 69/31 | 69/31 | 69/31 | 69/31 | 69/31 | 69/31 | 69/31 | 69/31 | 69/31 |
| ETFE/PC (volume ratio) |  | 60/40 | 60/40 | 60/40 | 60/40 | 60/40 | 60/40 | 60/40 | 60/40 | 60/40 | 60/40 |
| Amount of components in master batch (parts by mass) | ETFE | — | 3.1 | 1.3 | 3.3 | — | 6.5 | 1.4 | 0.7 | 1.4 | 1.4 |
|  | PC | — | 1.4 | 0.6 | 1.5 | — | 2.9 | 0.6 | 0.3 | 0.6 | 0.6 |
|  | Catalyst | — | 1.2 | 0.4 | 0.9 | — | 1.8 | 0.037 | 0.018 | 0.037 | 0.037 |
|  | Total amount (X) | — | 5.6 | 2.3 | 5.6 | — | 11.3 | 2.1 | 1.0 | 2.1 | 2.1 |

TABLE 2-continued

|  |  | Ex. 11 | Ex. 12 | Ex. 13 | Ex. 14 | Ex. 15 | Ex. 16 | Ex. 17 | Ex. 18 | Ex. 19 | Ex. 20 |
|---|---|---|---|---|---|---|---|---|---|---|---|
| Concentration of catalyst in master batch (mass %) | | — | 21 | 16 | 16 | — | 16 | 1.8 | 1.8 | 1.8 | 1.8 |
| Amount of components added later (parts by mass) | ETFE | — | 64.7 | 67.0 | 64.7 | — | 60.8 | 67.2 | 67.9 | 67.2 | 67.2 |
| | PC | — | 29.6 | 30.7 | 29.7 | — | 27.9 | 30.8 | 31.1 | 30.8 | 30.8 |
| | Total amount (Y) | — | 94.4 | 97.7 | 94.4 | — | 88.8 | 97.9 | 99.0 | 97.9 | 97.9 |
| X/Y (mass ratio) | | — | 5.6/94.4 | 2.3/97.7 | 5.6/94.4 | — | 11.3/88.8 | 2.1/97.9 | 1.0/99.9 | 2.1/97.9 | 2.1/97.9 |
| Master batch kneading conditions | Kneading temp.(° C.) | — | 280 | 280 | 280 | — | 280 | 280 | 280 | 280 | 280 |
| | Kneading time (min) | — | 7 | 5 | 5 | — | 5 | 5 | 5 | 5 | 5 |
| Kneading conditions | Kneading temp.(° C.) | 280 | 280 | 280 | 280 | 280 | 280 | 280 | 280 | 280 | 280 |
| | Kneading time (min) | 25 | 25 | 25 | 25 | 25 | 25 | 25 | 25 | 25 | 25 |
| Evaluation of physical properties | Elongation (%) | 148.4 | 157.7 | 184.2 | 229.6 | 147.1 | 217.0 | 198.4 | 233.1 | 259.5 | 13.7 |
| | Maximum stress (MPa) | 42.3 | 44.3 | 44.4 | 50.1 | 42.3 | 48.7 | 48.3 | 50.3 | 54.3 | 30.3 |
| PCT Test | Elongation (%) | — | — | — | 101.0 | — | — | — | — | — | — |
| | Retention of elongation (%) | — | — | — | 44.0 | — | — | — | — | — | — |
| | Maximum stress (MPa) | — | — | — | 39.8 | — | — | — | — | — | — |
| | Retention of maximum stress (%) | — | — | — | 79.3 | — | — | — | — | — | — |

TABLE 3

|  |  | Ex. 21 | Ex. 22 | Ex. 23 | Ex. 24 | Ex. 25 | Ex. 26 | Ex. 27 | Ex. 28 | Ex. 29 | Ex. 30 |
|---|---|---|---|---|---|---|---|---|---|---|---|
| ETFE (parts by mass) | ETFE-1 | — | — | — | — | — | — | — | — | — | — |
| | ETFE-2 | — | — | 59.3 | — | — | 59.3 | — | — | — | — |
| | ETFE-3 | 68.5 | 59.3 | — | 58.4 | 59.2 | — | 59.3 | — | — | — |
| | ETFE-4 | — | — | — | — | — | — | — | 59.3 | 68.6 | — |
| | ETFE-6 | — | — | — | — | — | — | — | — | — | 68.6 |
| PC (parts by mass) | PC-1 | — | — | — | — | — | — | — | — | — | — |
| | PC-2 | 31.3 | 40.7 | 40.7 | 40.0 | 40.6 | 40.7 | 40.7 | 40.7 | 31.4 | 31.4 |
| Content (mass %) | | 99.8 | 100.0 | 100.0 | 98.4 | 99.8 | 100.0 | 100.0 | | | |
| Trans-esterification catalyst (parts by mass) | C-1 | — | — | — | 1.6 | — | — | — | — | — | — |
| | C-2 | — | — | — | — | 0.2 | — | — | — | — | — |
| | C-3 | — | — | — | — | — | — | — | — | — | — |
| | C-4 | — | — | — | — | — | — | — | — | — | — |
| | C-5 | — | — | — | — | — | — | — | — | — | — |
| | C-6 | 0.18 | — | — | — | — | 0.037 | 0.037 | 0.037 | 0.037 | 0.037 |
| Sum (parts by mass) | | 100.0 | 100.0 | 100.0 | 100.0 | 100.0 | 100.0 | 100.0 | 100.0 | 100.0 | 100.0 |
| ETFE/PC (mass ratio) | | 69/31 | 59/41 | 59/41 | 59/41 | 59/41 | 59/41 | 59/41 | 59/41 | 69/31 | 69/31 |
| ETFE/PC (volume ratio) | | 60/40 | 50/50 | 50/50 | 50/50 | 50/50 | 50/50 | 50/50 | 50/50 | 50/50 | 50/50 |
| Amount of components in master batch (parts by mass) | ETFE | 6.8 | — | — | — | — | 1.4 | 1.4 | — | — | — |
| | PC | 3.0 | — | — | — | — | 0.6 | 0.6 | — | — | — |
| | Catalyst | 0.18 | — | — | — | — | 0.037 | 0.037 | — | — | — |
| | Total amount (X) | 10.0 | — | — | — | — | 2.1 | 2.1 | — | — | — |
| Concentration of catalyst in master batch (mass %) | | 1.8 | — | — | — | — | 1.8 | 1.8 | — | — | — |
| Amount of components added later (parts by mass) | ETFE | 61.7 | — | — | — | — | 57.9 | 57.9 | — | — | — |
| | PC | 28.3 | — | — | — | — | 40.1 | 40.1 | — | — | — |
| | Total amount (Y) | 90.0 | — | — | — | — | 97.9 | 97.9 | — | — | — |
| X/Y (mass ratio) | | 10.0/90.0 | — | — | — | — | 2.1/97.9 | 2.1/97.9 | — | — | — |
| Master batch kneading conditions | Kneading temp.(° C.) | 280 | — | — | — | — | 280 | 280 | — | — | — |
| | Kneading time (min) | 5 | — | — | — | — | 5 | 5 | — | — | — |
| Kneading conditions | Kneading temp.(° C.) | 280 | 280 | 280 | 280 | 280 | 280 | 280 | 280 | 280 | 280 |
| | Kneading time (min) | 25 | 25 | 25 | 25 | 25 | 25 | 25 | 20 | 20 | 20 |
| Evaluation of physical properties | Elongation (%) | 214.1 | 22.8 | 8.6 | 181.4 | 198.7 | 8.4 | 202.2 | 223.0 | 253.0 | 181.0 |
| | Maximum stress (MPa) | 48.7 | 39.5 | 34.8 | 51.1 | 53.3 | 35.6 | 56.8 | 60.0 | 55.0 | 50.0 |
| PCT Test | Elongation (%) | — | — | — | — | — | — | — | 135.0 | 171.0 | 102.3 |
| | Retention of elongation (%) | — | — | — | — | — | — | — | 61 | 68 | 57 |

TABLE 3-continued

|  | Ex. 21 | Ex. 22 | Ex. 23 | Ex. 24 | Ex. 25 | Ex. 26 | Ex. 27 | Ex. 28 | Ex. 29 | Ex. 30 |
|---|---|---|---|---|---|---|---|---|---|---|
| Maximum stress (MPa) | — | — | — | — | — | — | — | 47.7 | 43.6 | 42.2 |
| Retention of maximum stress (%) | — | — | — | — | — | — | — | 79.5 | 79.3 | 84.4 |

(Electron Microscope Observation)

Figure 1:
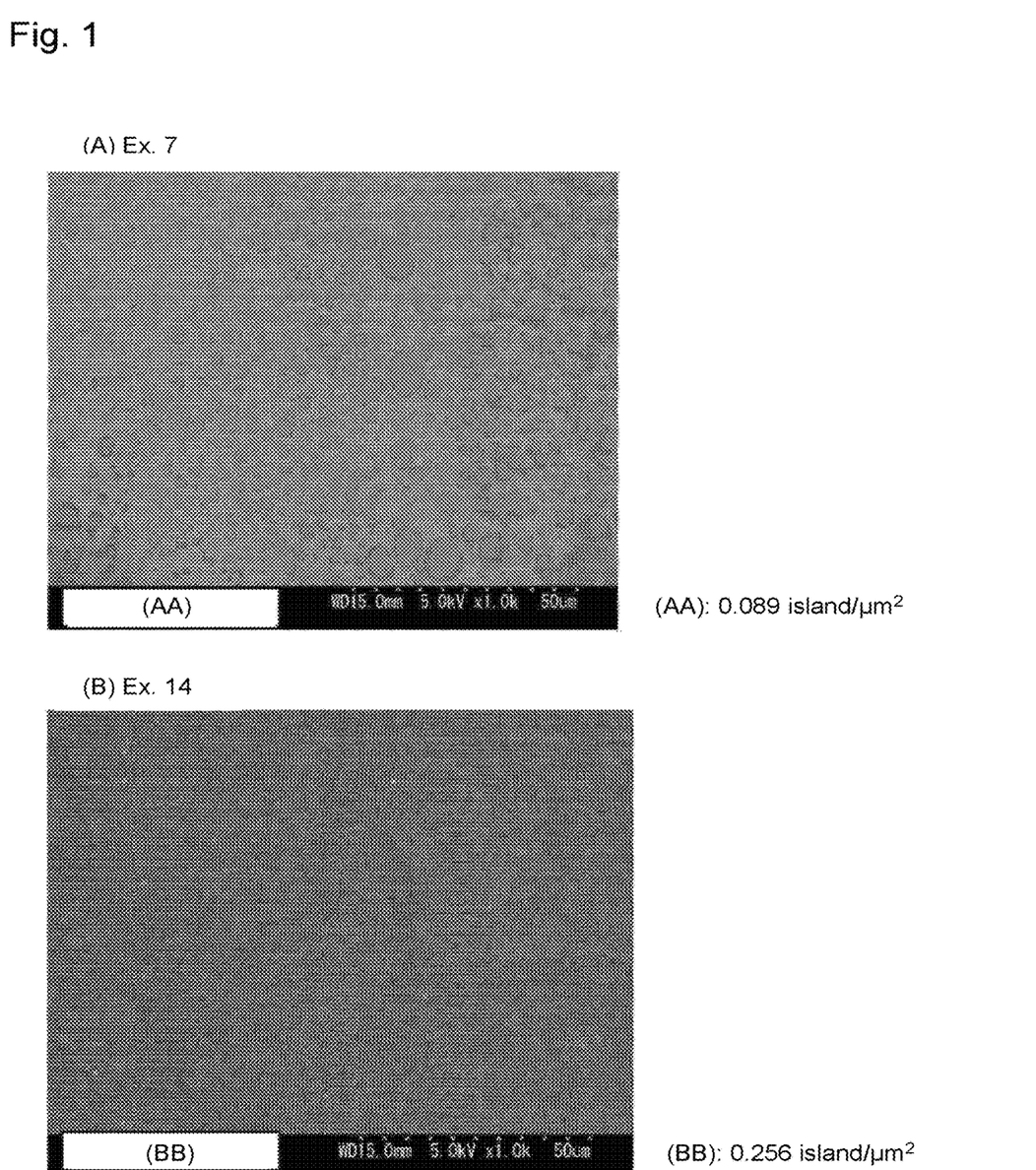
FIG. 1 illustrates reflected scanning electron microscope images of the cross-section cut of strands prepared by using melt-kneaded products in Ex. 7 and 14.

The melt-kneaded product obtained in each of Ex. 7 and 14 was preheated for 10 minutes, and extruded from a die hole with L/D of 10 and a diameter of 1 mm at a rate of 10 mm/min to prepare a strand by means of a capirograph (CAPIROGRAPH 1C manufactured by Toyo Seiki Seisaku-sho, Ltd.). The obtained strand was cooled with liquid nitrogen and cut by a razor to prepare a sample, the sample was carbon-coated, and a reflected scanning electron microscope image of the cross section with a scanning electron microscope (S4300 manufactured by Hitachi, Ltd.) was photographed (1,000-fold magnification) at an accelerating voltage of 5 kV. The results are shown in FIG. 1. (A) and (B) correspond to Ex. 7 and 14, respectively. The bright portion represents a continuous phase of the ETFE, and the dark portion represents a dispersed phase of the polycarbonate resin.

(Torque Evaluation)

In Ex. 7, 19 and 20, changes of torques applied to the axis of rotation when melt-kneading was carried out by Labo Plastom ill mixer manufactured by Toyo Seiki Seisaku-sho, Ltd. was measured. The change of the torque is estimated as a change of the viscosity of the melt-kneaded product, and an increase of the torque corresponds to an increase of the viscosity.

(Preparation of Laminated Product)

A fluororesin sheet having a thickness of 300 μm was obtained in accordance with the method disclosed in the above (Preparation of molding product) except that a mold having a thickness of 300 μm was used. The fluororesin used was ETFE-2 or ETFE-3.

A polycarbonate resin sheet having a thickness of 600 μm was obtained in accordance with the method disclosed in the above (Preparation of molding product) except that a mold having a thickness of 600 μm was used. The polycarbonate resin used was PC-2.

A center portion of a 15 cm square sheet of polyimide (tradename: Kapton) having a thickness of 125 μm was cut out into a 7 cm square. The cut out portion was filled with the melt-kneaded product in Ex. as identified in Table 4, and using the resulting sheet, a molding product to be an adhesive layer was obtained in accordance with the method disclosed in the above (Preparation of molding product).

In a mold having a thickness of 1,100 μm, the fluororesin sheet as identified in Table 4, the molding product to be an adhesive layer and a polycarbonate resin sheet were overlaid in this order and set to a pressing machine (Mini Test Press MP-WCL manufactured by Toyo Seiki Seisaku-sho, Ltd.) set at 280° C., and a mirror plate of 150 mm×150 mm was used as a cover. The overlaid sheets were preheated for 5 minutes, then subjected to compression molding under a contact pressure of 8.7 MPa for 5 minutes and cooled under a contact pressure of 8.7 MPa for 5 minutes to obtain a laminated product formed in the size of the mold.

(Peel Test)

The obtained laminated product was cut into a width of 1 cm and a length of 10 cm to prepare a peel test specimen. Using a TENSILON universal testing instrument (manufactured by A&D Company Limited), the polycarbonate resin sheet portion and the fluororesin sheet portion at the edge of the short side of the test specimen were grasped, and the peel strength with N (sample number) of from 3 to 8 was obtained by a tensile test at a rate of 20 mm/min. The average value of forces applied at tensile distances of from 30 mm to 100 mm was defined as the initial peel strength of the sample. The results are shown in Table 4.

(PCT Test)

The obtained laminated product was held at 120° C. in a humidity supersaturation state for 24 hours in a PCT apparatus (EHS-411MD manufactured by ESPEC CORP.), and then the laminated product was subjected to a peel test in the same manner as mentioned above to measure the peel strength with N (sample number) of from 2 to 3. The adhesive strength was defined as follows and the adhesion was compared.

⊚ (Excellent): high adhesion before and after the PCT test for 24 hours.

○ (good): high adhesion initially, but low adhesion after the PCT test for 24 hours.

Δ (fair): low adhesion before and after the PCT test for 24 hours.

x (poor): no adhesion initially.

Here, the adhesion is based on the following standards.

High adhesion: a peel strength with an average value of forces applied from 30 to 100 mm being at least 10 N/cm.

Low adhesion: a peel strength with an average value of forces applied from 30 to 100 mm being at least 1 N/cm and less than 10 N/cm.

No adhesion: a peel strength with an average value of forces applied from 30 to 100 mm being less than 1N/cm.

The results are shown in Table 4.

TABLE 4

| | Molding product (resin composition used) | | | | | | | |
|---|---|---|---|---|---|---|---|---|
| | Ex. 7 | Ex. 19 | Ex. 22 | Ex. 23 | Ex. 24 | Ex. 25 | Ex. 26 | Ex. 27 |
| Fluororesin sheet (fluororesin used) | ETFE-3 | ETFE-3 | ETFE-3 | ETFE-2 | ETFE-3 | ETFE-3 | ETFE-2 | ETFE-3 |
| Initial peel strength (N/cm) | 0.1 | 0.1 | 19.7 | 31.3 | 23 | 22.7 | 2.5 | 23.7 |
| Peel strength after PCT test for 24 hours (N/cm) | — | — | 7.2 | 5.2 | 19.6 | 22.5 | 4.5 | 17.4 |
| Adhesion | X | X | ○ | ○ | ⊚ | ⊚ | Δ | ⊚ |

In Ex. 2, 4, 8 to 19, 21, 24, 25 and 27 to 30 (Examples of the present invention), excellent mechanical strength (maximum stress) and elongation were obtained.

By comparisons between Ex. 1 (Comparative Example) and Ex. 2 (Example of the present invention), between Ex. 3 (Comparative Example) and Ex. 4 (Example of the present invention), between Ex. 7 (Comparative Example) and Ex. 8 (Example of the present invention), between Ex. 22 (Comparative Example) and Ex. 24, 25 and 27 (Examples of the present invention), it is confirmed that the mechanical strength and the elongation are improved by addition of a transesterification catalyst when an ETFE having a hydroxy group is used. Whereas, by comparisons between Ex. 5 (Comparative Example) and Ex. 6 (Comparative Example) and between Ex. 23 (Comparative Example) and Ex. 26 (Comparative Example) in which an ETFE having no hydroxy group was used, it is confirmed that there is no effect of the transesterification catalyst and the elongation rather decreases.

By comparison between Ex. 15 (Example of the present invention) and Ex. 16 (Example of the present invention), it is confirmed that more excellent mechanical strength and elongation can be obtained in Ex. 16 in which the master batch method was employed. Further, by comparison between Ex. 13 (Example of the present invention) and Ex. 15 (Example of the present invention), it is confirmed that improvement of the mechanical strength and the elongation can be expected even with a small amount of a transesterification catalyst, by employing the master batch method.

By comparison between Ex. 27 (Example of the present invention) and Ex. 28 (Example of the present invention), it is confirmed that more excellent mechanical strength and elongation can be obtained in Ex. 28 in which an ETFE having a carbonyl group was used and the master batch method was not employed than in Ex. 27 in which an ETFE having a hydroxy group was used and the master batch method was employed. This is considered to be because a carbonyl group could be introduced into an ETFE without lowering the molecular weight and the reaction of the ETFE and the PC could be efficiently conducted at the time of melt-kneading.

By comparison between Ex. 17 (Example of the present invention) and Ex. 19 (Example of the present invention), it is confirmed that a great improvement of the mechanical strength and the elongation can be expected by using zinc oxide with a small average particle size.

Further, by comparison between Ex. 7 (Comparative Example) and Ex. 8 (Example of the present invention), it is confirmed that excellent mechanical strength and elongation are maintained by the present invention even after the PCT test. Further, it is confirmed that in Ex. 14 (Example of the present invention), excellent mechanical strength and elongation are maintained after the PCT test.

From the reflected scanning electron microscope images of the strands in Ex. 7 (Comparative Example) and Ex. 14 (Example of the present invention) shown in FIG. 1, it is confirmed that in Ex. 14 (Example of the present invention), when the melt-kneaded product is formed into a strand, it has a morphology such that islands of the sea-island structure are thinly and uniformly dispersed.

Figure 2:
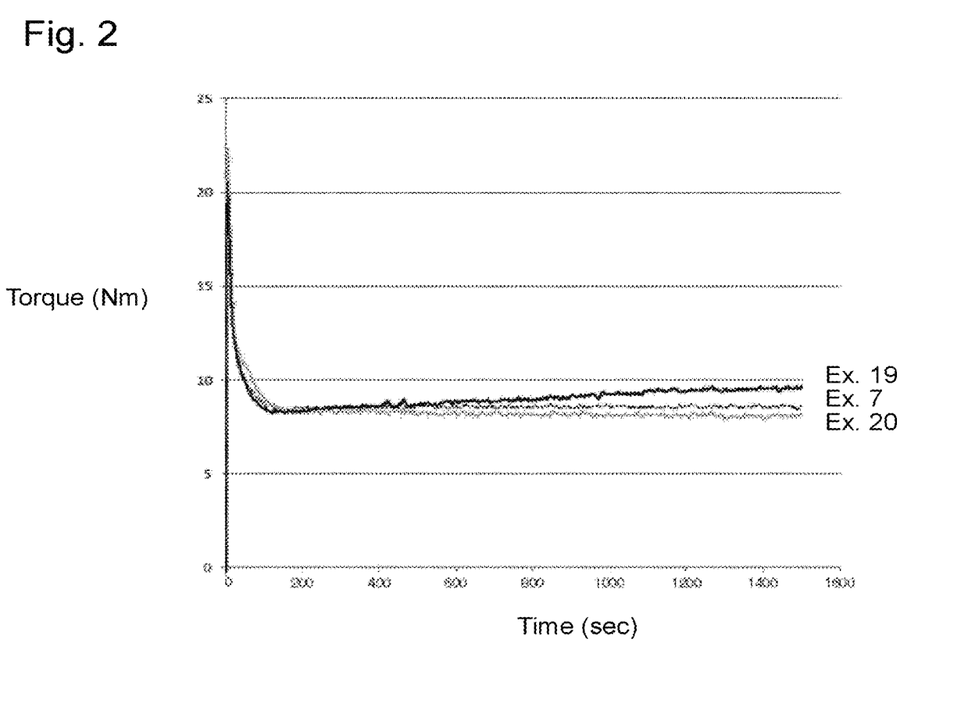
FIG. 2 is a view illustrating changes of torques when resin compositions in Ex. 7, 19 and 20 are melt-kneaded.

Further, as shown in FIG. 2, in Ex. 19 (Example of the present invention), the torque once decreases and then increases with time. Such a phenomenon is not observed in Ex. 20 (Comparative Example) in which an ETFE having no hydroxy group was used and in Ex. 7 (Comparative Example) in which a transesterification catalyst was not used. It is considered that since the ETFE and the polycarbonate resin underwent transesterification to form a reaction product, the viscosity increased, and such is observed as an increase of the torque.

By comparison between Ex. 19 (Example of the present invention) and Ex. 27 (Example of the present invention), it is found that the resin composition of the present invention preferably has a volume ratio of the ETFE to the polycarbonate resin in the vicinity of 50/50, with a view to developing the adhesion of the molding product. Further, by comparison between Ex. 22 (Comparative Example) and Ex. 24, 25 and 27 (Examples of the present invention), the molding product of the present invention can maintain high adhesion even after the PCT test for 24 hours by containing the transesterification catalyst. Further, as shown in Ex. 23 (Comparative Example) and Ex. 26 (Comparative Example), it is found that when an ETFE having no hydroxy group is used, there is no effect to improve the adhesion after the PCT test for 24 hours even when the transesterification catalyst is blended. From such results, it is found that by controlling the compositional ratio of the fluororesin and the ester bond-containing resin in the resin composition of the present invention, when a molding product of such a resin composition is used as an adhesive layer of a laminated product, resistance to moist heat is obtained.

INDUSTRIAL APPLICABILITY

According to the present invention, it is possible to provide a resin composition and its melt-kneaded product from which a molding product having excellent mechanical strength and elongation can be produced, and a molding product, film or sheet thereof, a laminated product and a backsheet for a solar cell.

The molding product of the present invention is useful, specifically, for a resin building material for a rain water gutter, etc. and a molding product such as a sign, an automobile exterior equipment, etc. Further, by forming the resin composition or its melt-kneaded product into a film or sheet, such a film or sheet is not only used for a backsheet for a solar cell but also applicable to a mold release film or a high weather resistant sheet. Further, the molding product of the present invention may be used as an adhesive layer of a laminated product.

What is claimed is:
1. A resin composition comprising:
   a fluororesin having at least one of a hydroxy group and a carbonyl group;
   an ester bond-containing resin having no fluorine atom; and
   a transesterification catalyst which is not zinc oxide,
   wherein a volume ratio of the fluororesin to the ester bond-containing resin is from 40/60 to 99.9/0.1, and an amount of the transesterification catalyst is from 0.001 to 20 parts by mass per 100 parts by mass of a sum of the fluororesin, the ester bond-containing resin and the transesterification catalyst, and
   wherein in the resin composition the fluororesin and the ester bond-containing resin are subject to a transesterification reaction.
2. The resin composition according to claim 1, wherein the ester bond-containing resin is a polyester resin or a polycarbonate resin.
3. The resin composition according to claim 1, wherein the fluororesin is an ethylene/tetrafluoroethylene copolymer or a tetrafluoroethylene/perfluoroalkyl vinyl ether copolymer.

4. The resin composition according to claim 1, wherein the transesterification catalyst is at least one member selected from the group consisting of a metal salt of an organic acid, a metal salt of a carbonic acid, a metal oxide and a metal hydroxide.

5. The resin composition according to claim 4, wherein the transesterification catalyst is at least one member selected from the group consisting of a zinc salt of a carboxylic acid, a magnesium salt of a carboxylic acid, zinc carbonate, magnesium carbonate, magnesium oxide, zinc hydroxide and magnesium hydroxide.

6. The resin composition according to claim 1, wherein the transesterification catalyst has a shape of a sphere or agglomerate, and an average particle size of the transesterification catalyst is from 0.01 to 10 μm.

7. The resin composition according to claim 1, wherein the transesterification catalyst has a shape of a needle, and an average axial length of the transesterification catalyst is from 0.01 to 10 μm.

8. The resin composition according to claim 1, wherein a mass ratio of the fluororesin to the ester bond-containing resin is from 50/50 to 99.9/0.1.

9. The resin composition according to claim 1, wherein a mass ratio of the fluororesin to the ester bond-containing resin is from 65/35 to 99.9/0.1.

10. The resin composition according to claim 1, wherein the volume ratio of the fluororesin to the ester bond-containing resin is from 60/40 to 99.9/0.1.

11. The resin composition according to claim 1, wherein the amount of the transesterification catalyst is from 0.01 to 10 parts by mass per 100 parts by mass of the sum of the fluororesin, the ester bond-containing resin and the transesterification catalyst.

12. A molding compound, consisting of a melt-kneaded product of the resin composition as defined in claim 1.

13. A molding product obtained by melt-processing the resin composition as defined in claim 1.

14. The molding product according to claim 13, wherein the molding product has a micro-phase separation structure having a continuous phase and a dispersed phase, the continuous phase consists of the fluororesin, and the dispersed phase consists of the ester bond-containing resin.

15. A laminated product having at least three-layered structure, the at least three-layered structure comprising: a layer of the molding product as defined in claim 13; a layer of a fluororesin; and a layer of an ester bond-containing resin, wherein the layer of the molding product is disposed between the layer of a fluororesin and the layer of an ester bond-containing resin.

16. The molding product according to claim 13, wherein the molding product is a film or a sheet.

17. A backsheet for a solar cell, comprising the film or the sheet as defined in claim 16, wherein the film or the sheet has a thickness of from 10 to 100 μm.

18. A method for producing a molding compound, the method comprising melt-kneading the resin composition as defined in claim 1.

19. A method for producing a molding product, the method comprising melt-processing the molding compound as defined in claim 12.

* * * * *